(12) United States Patent
Choi et al.

(10) Patent No.: US 10,599,540 B2
(45) Date of Patent: Mar. 24, 2020

(54) MEMORY TEST SYSTEM AND AN OPERATING METHOD THEREOF

(71) Applicant: SK hynix Inc., Gyeonggi-do (KR)

(72) Inventors: In Ho Choi, Gyeonggi-do (KR); Ho Ryong Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/828,701

(22) Filed: Dec. 1, 2017

(65) Prior Publication Data

US 2018/0285228 A1    Oct. 4, 2018

(30) Foreign Application Priority Data

Mar. 29, 2017    (KR) ................. 10-2017-0040086

(51) Int. Cl.
| | |
|---|---|
| *G06F 11/30* | (2006.01) |
| *G06F 3/06* | (2006.01) |
| *G11C 29/52* | (2006.01) |
| *G11C 29/56* | (2006.01) |
| *G11C 29/46* | (2006.01) |
| *G11C 29/44* | (2006.01) |
| *G11C 29/10* | (2006.01) |
| *G11C 29/42* | (2006.01) |
| *G06F 11/34* | (2006.01) |
| *G11C 29/12* | (2006.01) |
| *G11C 29/04* | (2006.01) |
| *G11C 29/36* | (2006.01) |
| *G11C 29/00* | (2006.01) |

(52) U.S. Cl.
CPC ........ *G06F 11/3034* (2013.01); *G06F 3/0653* (2013.01); *G11C 29/10* (2013.01); *G11C 29/42* (2013.01); *G11C 29/44* (2013.01); *G11C 29/46* (2013.01); *G11C 29/52* (2013.01); *G11C 29/56004* (2013.01); *G06F 11/3485* (2013.01); *G11C 29/76* (2013.01); *G11C 2029/0409* (2013.01); *G11C 2029/1208* (2013.01); *G11C 2029/3602* (2013.01); *G11C 2029/5606* (2013.01)

(58) Field of Classification Search
CPC ............. G06F 11/3034; G06F 11/3485; G06F 3/0653; G11C 29/52
See application file for complete search history.

(56) References Cited

U.S. PATENT DOCUMENTS

| 5,615,335 | A | * | 3/1997 | Onffroy | ................. G11C 29/12 |
|---|---|---|---|---|---|
| | | | | | 714/25 |
| 9,874,585 | B2 | * | 1/2018 | Smith | ................ G01R 1/07342 |

FOREIGN PATENT DOCUMENTS

KR    100959046    5/2010

* cited by examiner

*Primary Examiner* — Phung M Chung
(74) *Attorney, Agent, or Firm* — IP & T Group LLP

(57) ABSTRACT

A memory test system may include: a data storage device including a nonvolatile memory device, and a controller configured to control an operation of the nonvolatile memory device; and a test device configured to: request a test to the data storage device; request, to the data storage device, an output of a variable to be generated through driving of a firmware for performing the test, while the test is performed in the data storage device; and determine whether the firmware is normally driven based on the variable outputted from the data storage device.

18 Claims, 12 Drawing Sheets

FIG.2

VIT

| Variable Name | Address | Size |
|---|---|---|
| ⋮ | ⋮ | ⋮ |
| Read Count | 0x10005600 | 4 |
| Program Count | 0x30002420 | 4 |
| ⋮ | ⋮ | ⋮ |

DCR

| $C_1$ | $C_2$ | $C_3$ | $C_4$ | ... | $C_n$ |
|---|---|---|---|---|---|
| $C_{1+n}$ | $C_{2+n}$ | $C_{3+n}$ | $C_{4+n}$ | ... | $C_{2n}$ |
| $C_{1+2n}$ | $C_{2+2n}$ | $C_{3+2n}$ | $C_{4+2n}$ | ... | $C_{3n}$ |
| $C_{1+3n}$ | $C_{2+3n}$ | $C_{3+3n}$ | $C_{4+3n}$ | ... | $C_{4n}$ |
| ⋮ | ⋮ | ⋮ | ⋮ | ⋱ | ⋮ |
| $C_{1+(m-1)n}$ | $C_{2+(m-1)n}$ | $C_{3+(m-1)n}$ | $C_{4+(m-1)n}$ | ... | $C_{mn}$ |

DCR

| NO. | Value |
|---|---|
| ⋮ | ⋮ |
| #1 ~ #n | |
| #1 ~ #n | |
| ⋮ | ⋮ |

0x10005600 → (start of Read Count region)

0x30002420 → (start of Program Count region)

RCT

| NO. | Value |
|---|---|
| #1 | 499 |
| #2 | 240 |
| #3 | blank |
| ⋮ | ⋮ |
| #n-1 | blank |
| #n | blank |

RCT

| NO. | Value |
|---|---|
| #1 | 500 |
| #2 | 240 |
| #3 | 0 |
| ⋮ | ⋮ |
| #n-1 | blank |
| #n | blank |

FIG.9E

BBT

| NO. | Value |
|---|---|
| #1 | 1 |
| #2 | 0 |
| #3 | 0 |
| ... | ... |
| #n-1 | 0 |
| #n | 0 |

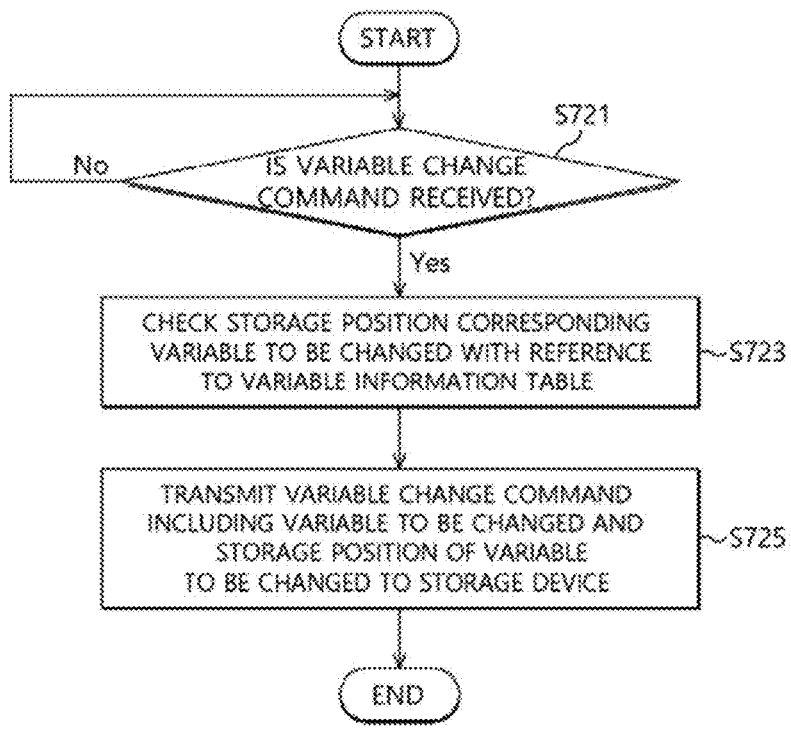

MEMORY TEST SYSTEM AND AN OPERATING METHOD THEREOF

CROSS-REFERENCES TO RELATED APPLICATION

The present application claims priority under 35 U.S.C. § 119(a) to Korean application number 10-2017-0040086, filed on Mar. 29, 2017, which is incorporated herein by reference in its entirety.

BACKGROUND

1. Technical Field

Various embodiments generally relate to a semiconductor device. More particularly, the embodiments of the present disclosure relate to a system and a method for testing a memory.

2. Related Art

A memory device goes through various tests to check whether it is normally operated, after it has been fabricated. The tests for the memory device includes a black-box test, which is performed in a state in which a policy of firmware (FW) stored in the memory device is unknown, and a white-box test, which is performed in a state in which the policy of the FW has been known.

Generally, a test for memory devices is performed through a process of determining accuracy of response of each memory device on a certain test command. If the response of a memory device is not accurate, it is determined that the corresponding memory device is defective and then defect analysis of the memory device is performed using a separate debugging apparatus.

As such, since an operating test for memory devices and a defect analysis of a memory device that has been determined as being defective are separately performed, testing time and cost are increased.

SUMMARY

Various embodiments provide system and method for testing a memory capable of monitoring in real time driving conditions of firmware.

Various embodiments provide system and method for testing a memory capable of reducing testing time.

Various embodiments provide system and method for testing a memory capable of easily measuring test coverage of the firmware.

In an embodiment, a memory test system may include: a data storage device comprising a nonvolatile memory device, and a controller configured to control an operation of the nonvolatile memory device; and a test device configured to: request a test to the data storage device; request, to the data storage device, an output of a variable to be generated through driving of a firmware for performing the test, while the test is performed in the data storage device; and determine whether the firmware is normally driven based on the variable outputted from the data storage device.

In an embodiment, a method for testing a memory may include: transmitting, to a data storage device, a test command for performing a test for the data storage device; monitoring a variable generated through driving of a firmware for performing the test corresponding to the test command while the test is performed in the data storage device; determining whether the variable is valid; and determining whether a test result received from the data storage device is normal if the variable is valid.

In an embodiment, an operating method of a memory test device may include: requesting a variable generated while a firmware is being driven in a test operation to a data storage device; and determining normal driving of the firmware based on the variable. The data storage device includes the firmware and a memory device. The firmware controls the memory device when driven.

BRIEF DESCRIPTION OF THE DRAWINGS

FIG. 2 is a diagram illustrating an example of a variable information table.

FIG. 6 is a diagram illustrating an example of a variable table.

FIG. 9E is a diagram illustrating an example of a change in a variable corresponding to the memory block, the read count value of which has reached threshold value or more, in a bad block table.

FIG. 11 is a flowchart illustrating in detail step S720 of FIG. 10.

FIG. 12 is a diagram illustrating an example in which a read count value of a certain memory body is changed to a predetermined value.

DETAILED DESCRIPTION

Figure 1:
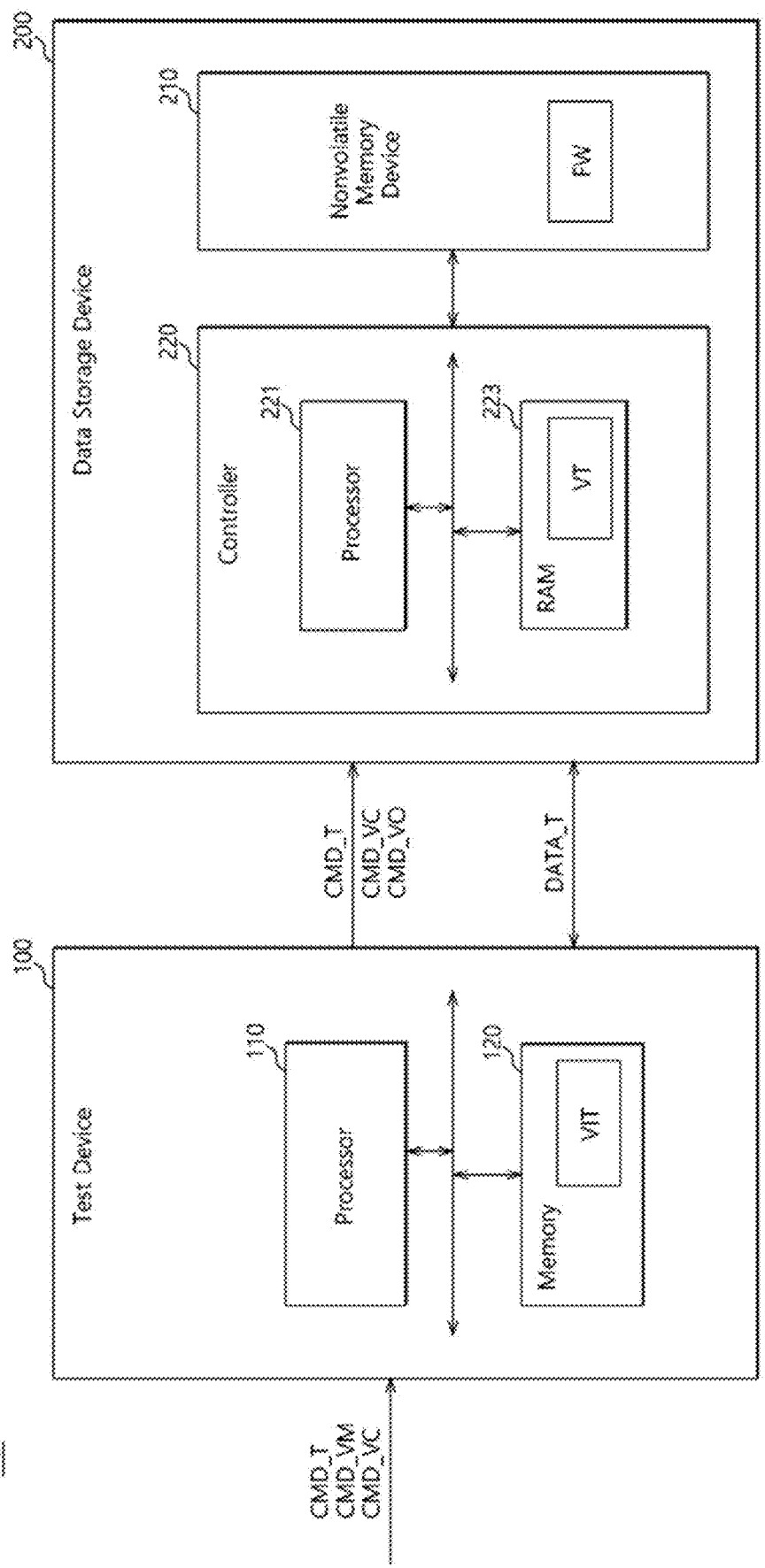
FIG. 1 is a block diagram schematically illustrating a memory test system in accordance with an embodiment of the present disclosure.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram schematically illustrating a memory test system 10 in accordance with an embodiment of the present disclosure.

The memory test system 10 in accordance with the embodiment may include a test device 100 and a data storage device 200.

The test device 100 may be a device for checking whether the data storage device 200 performs a normal operation. For instance, the test device 100 may be configured of any one of various devices such as a cellular phone, an MP3 player, a laptop computer, a desktop computer, a game machine, a TV, and an in-vehicle infotainment system. The test device 100 may be called a host device.

The test device 100 may include a processor 110 and a memory 120.

The processor 110 may control general operations of the test device 100. The processor 110 may provide, to the data storage device 200, various signals inputted from an external element to test the operation of the data storage device 200 or monitor driving conditions of firmware FW.

For example, the test device 100 may receive a test command CMD_T, a variable monitoring command CMD_VM, a variable change command CMD_VC, and so forth, from the external element, but commands to be inputted are not limited to these. Here, the external element may mean a tester. Furthermore, the test device 100 may provide the test command CMD_T, a variable output command CMD_VO, or the variable change command CMD_VC to the data storage device 200.

The test command CMD_T may be a command for testing various operations to be performed in the data storage device 200. For example, the test command CMD_T may include various test commands for testing all operations to be performed in the data storage device 200, such as a program test command for testing a program operation to be performed in the data storage device 200, and a read test command for testing a read operation. The test command CMD_T may include information such as the kind of test operation, an address, and test data, but information included in the test command CMD_T is not particularly limited to the above-mentioned list and may include other information.

The variable monitoring command CMD_VM may be a command for monitoring variables generated through the driving of the firmware FW stored in the data storage device 200, in a system data region of a nonvolatile memory device 210 of the data storage device 200. In other words, the variable monitoring command CMD_VM may be a command for monitoring in real time variables generated while a test is performed to the data storage device 200, and verifying whether the firmware FW is normally driven in accordance with a policy.

The test device 100 that has received the variable monitoring command CMD_VM from the tester may provide the variable output command CMD_VO to the data storage device 200. The variable output command CMD_VO may be a command for requesting output of variables generated through the driving of the firmware FW. The data storage device 200 that has received the variable output command CMD_VO from the test device 100 may provide, to the test device 100, variables generated through the driving of the firmware FW.

The firmware FW may mean a set of source codes for managing the nonvolatile memory device 210 such that various operations are performed in the nonvolatile memory device 210 in accordance with the operation guideline. In other words, the firmware FW may control background operations such as garbage collection, wear leveling, and read reclaim for managing the nonvolatile memory device 210.

Furthermore, when the firmware FW is driven, various variable tables may be generated. For example, the variable tables to be generated when the firmware FW is driven may include a read count table, a block management table, a physical to logical (P2L) table, a logical to physical (L2P) table, a bad block table, an EW cycle table, and so forth, but the kinds of variable tables are not limited to the above-mentioned list and may contain other kinds of variable tables. The generation of the variable tables during the driving of the firmware FW is well known in this art, so that those skilled in the art will easily appreciate that various other variable tables may be generated.

As shown in FIG. 1, a variable table VT generated during the driving of the firmware FW may be stored in a random access memory (RAM) 223 of a controller 220 of the data storage device 200. Here, a position at which the variable table VT is stored, an address, may be stored in advance in a variable information table VIT generated during a build of the firmware FW. The build of the firmware FW may include a process of generating object files by compiling source code files written using a programming language such as C language, and of generating an execution file by linking the generated object files. Here, during the process of compiling the source code files, an executable and linkable format (ELF) file may be generated, and the variable information table VIT may mean a symbol table included in the ELF file. The variable information table VIT may be stored in the memory 120 of the test device 100 by the tester.

FIG. 2 is a diagram illustrating an example of the variable information table VIT.

As shown in FIG. 2, the variable information table VIT may include a variable name, a variable storage position, i.e., a variable address, and a variable size. For example, the variable name may mean the kind of variable tables generated during the driving of the above-mentioned firmware FW. The variable address may mean an address that a corresponding variable is stored in the variable table VT of the random access memory 223 of the controller 220 of the data storage device 200. Furthermore, the variable address may mean a start address of a region in which each variable is stored. The variable size may mean the size of the region in which each variable is stored. That is, in the variable table VT, the region in which each variable is stored may be determined by the variable address and the variable size.

The variable change command CMD_VC may be a command for changing, to a predetermined value, a variable stored in the variable table VT stored in the random access memory 223 of the data storage device 200. To this end, the variable change command CMD_VC may include information such as a variable name, a variable position (address), and a variable value to be changed, but it is not particularly limited thereto.

Figure 3:
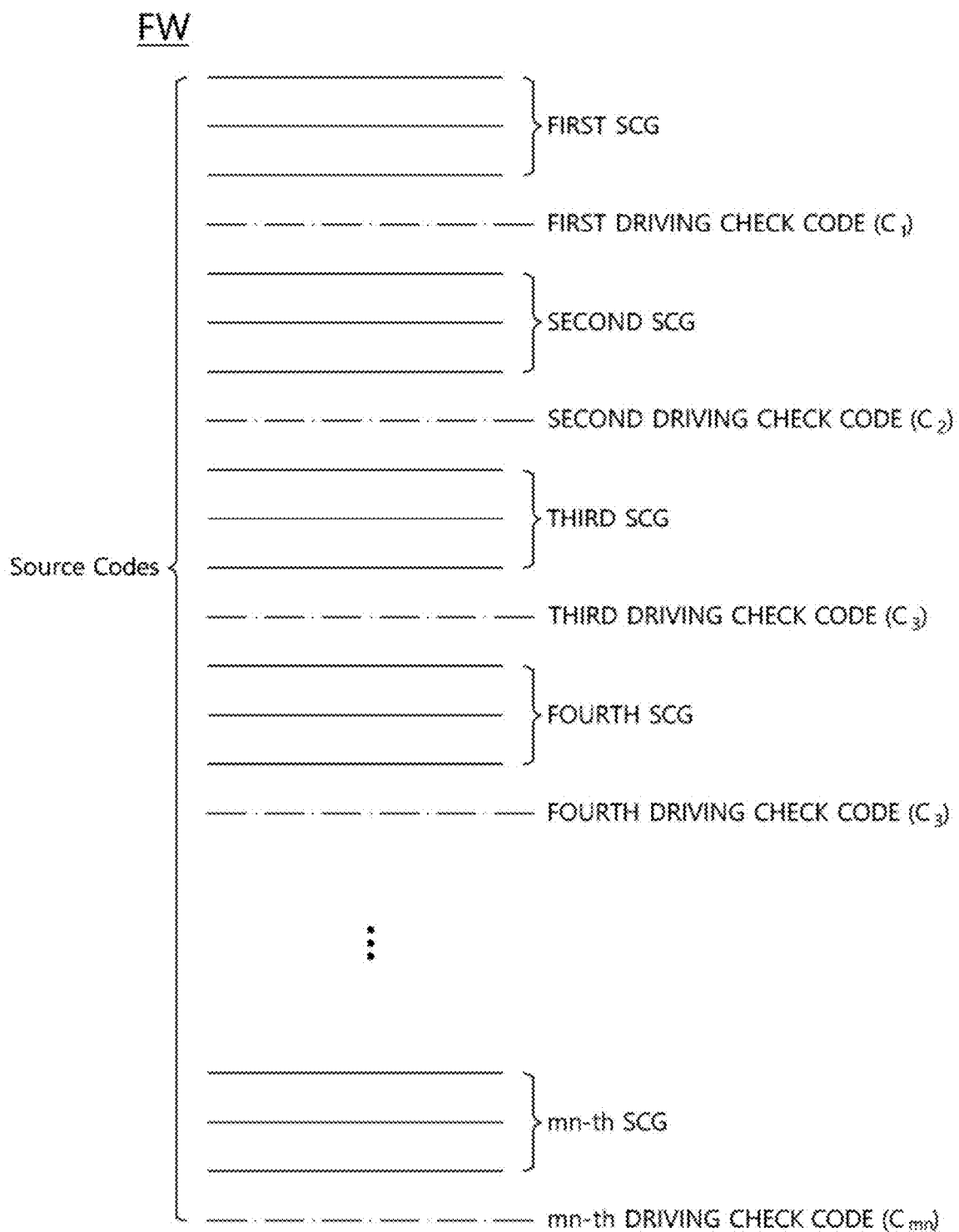
FIG. 3 is a diagram illustrating a plurality of source code groups and a plurality of driving check codes inserted between the plurality of source code groups.
Figures 4, 5:
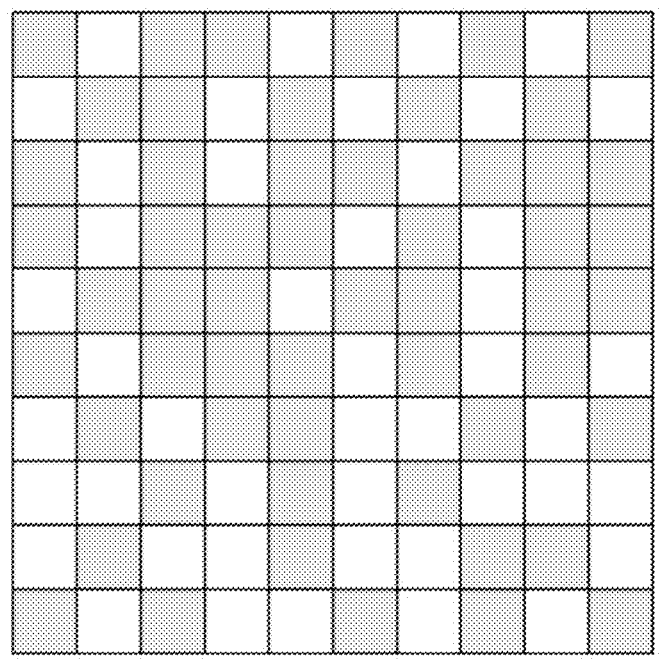
FIG. 4 is a diagram illustrating a driving check region which stores a value for representing whether each source code group of FIG. 10 is driven.
FIG. 5 is a diagram illustrating an example in which a first value is stored in the driving check region by driving of the driving check codes.

FIG. 3 is a diagram illustrating a plurality of source code groups and a plurality of driving check codes inserted between the plurality of source code groups, FIG. 4 is a diagram illustrating a driving check region which stores a value for representing whether each source code group of FIG. 3 is driven, and FIG. 5 is a diagram illustrating an example in which a first value is stored in the driving check region by driving of the driving check codes.

As shown in FIG. 3, the firmware FW may be formed of a plurality of source codes. For example, the firmware FW may include a plurality of source code groups FIRST SCG to mn-th SCG corresponding to a plurality of operations. Furthermore, the firmware FW may include a plurality of driving check codes $C_1$ to $C_{mn}$ inserted between the respective source code groups FIRST SCG to mn-th SCG.

Each of the driving check codes $C_1$ to $C_{mn}$ may be driven such that a first value is stored in a corresponding bit of a driving check region DCR illustrated in FIG. 4 when a corresponding one of the source code groups FIRST SCG to mn-th SCG is driven. For example, the first value may be '1', but it is not limited thereto.

Referring to FIG. 4, the driving check region DCR may be formed of bits corresponding to the number of driving check codes $C_1$ to $C_{mn}$. For example, if the first source code group FIRST SCG is driven to perform a first operation, the first driving check code $C_1$ may be driven such that a first value is stored in a corresponding bit (i.e., $C_1$) of the driving check region DCR. In this way, if all of the first to mn-th source code groups FIRST SCG to mn-th SCG are driven, the first value may be stored in the corresponding bits of the driving check region DCR by the driving check codes corresponding to the respective source code groups.

The test device 100 may calculate test coverage for the firmware FW with reference to the driving check region DCR. For instance, if the test device 100 transmits, to the data storage device 200, a variable output command CMD_VO requesting an output of the variables stored in the driving check region DCR, the data storage device 200 may provide the variables stored in the driving check region DCR to the test device 100. The test device 100 may calculate test coverage of the firmware FW based on the total number of bits forming the driving check region DCR and the number of bits in which the first value is stored.

For example, as shown in FIG. 5, if the driving check region DCR is formed of one hundred (100) bits and the number of bits (i.e., shaded bits) in which the first value has been stored is fifty-five (55), the test device 100 may determine that the test coverage of the firmware FW is 55%. As such, the test device 100 may easily calculate the test coverage of the firmware FW by monitoring in real time the variables stored in the driving check region DCR while performing a test on the data storage device 200.

The data storage device 200 may be formed of any one of various storage devices depending on an interface protocol to be coupled with the test device 100. For example, the data storage device 200 may be configured of any one of various storage devices such as a solid state drive (SSD), an MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The data storage device 200 may be manufactured in the form of any one of various package types. For example, the data storage device 200 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

Referring back to FIG. 1, the data storage device 200 may include the nonvolatile memory device 210 and the controller 220.

The controller 220 may control general operations of the data storage device 200. The controller 220 may decode and drive code type instruction or algorithm such as firmware FW or software. The controller 220 may be embodied in the form of hardware or a combination of hardware and software.

The controller 220 may include a processor 221 and the random access memory 223. Although not illustrated in FIG. 1, the controller 220 may further include an interface unit (not shown) capable of communicating with the test device 100, a memory control unit (not shown) capable of communicating with the nonvolatile memory device 210, and an error correction code (ECC) unit capable of generating Parity data for test data DATA_T provided from the test device 100 and detect and correct error of the test data DATA_T read out from the nonvolatile memory device 210 using the parity data.

The processor 221 may control general operations of the controller 220. The processor 221 may be configured of a micro control unit (MCU) and a central processing unit (CPU).

The processor 221 may perform a test to the nonvolatile memory device 210 in response to a test command CMD_T provided from the test device 100. The test command CMD_T may include information such as the kind of test operation, a test position information, and test data.

For example, if the test command CMD_T provided from the test device 100 is a program test command for a program operation test, the processor 221 may perform a program test of storing test data DATA_T in a test position of the nonvolatile memory device 210. If the test command CMD_T provided from the test device 100 is a read test command for a read operation test, the processor 221 may perform a read test of reading out test data DATA_T from the test position of the nonvolatile memory device 210.

Although the program test and the read test are illustrated as an example, the processor 221 may also perform a test on the nonvolatile memory device 210 in correspondence with information included in the test command CMD_T provided from the test device 100.

The random access memory 223 may store the firmware FW or the software to be driven by the processor 221. Also, the random access memory 223 may store data needed to drive the firmware FW or the software. In other words, the random access memory 223 may operate as a working memory of the processor 221.

The random access memory 223 may temporarily store test data DATA_T to be transmitted from the test device 100 to the nonvolatile memory device 210 or from the nonvolatile memory device 210 to the test device 100. In other words, the random access memory 223 may operate as a buffer memory.

The random access memory 223 may store the variable table VT in which variables generated during the driving of the firmware F are stored.

FIG. 6 is a diagram illustrating an example of the variable table VT.

Referring to FIG. 6, the variable table VT may include a plurality of kinds of variables. Although only a read count and a program count are shown as variables in FIG. 6, the variables included in the variable table VT are not particularly limited to this. Also, as shown in FIG. 2, a start address of each region in which the corresponding kind of variables are stored may be stored in the variable information table VIT. For example, as shown in FIGS. 2 and 6, a start address of a region where the read count is stored is '0x10005600', and a start address of a region where the program count is stored is '0x30002420'.

Although the variable table VT may include variables corresponding to the respective memory blocks included in the nonvolatile memory device 210, it is not particularly limited to this. For example, in the case where the nonvolatile memory device 210 includes n memory blocks, n read count variables (or n program count variables) for respective first to n-th memory blocks #1 to #n may be stored in the variable table VT.

Figure 7:
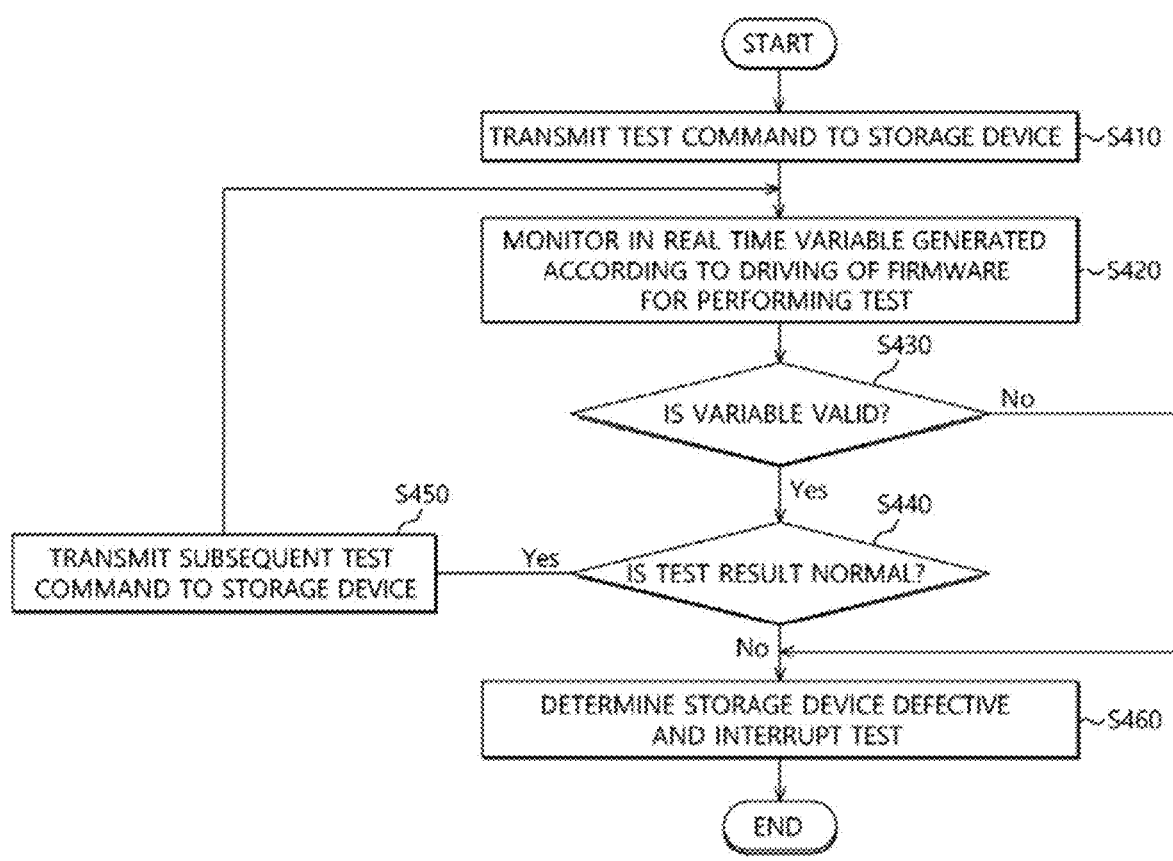
FIG. 7 is a flowchart showing a method for testing a memory in accordance with an embodiment.
Figure 8:
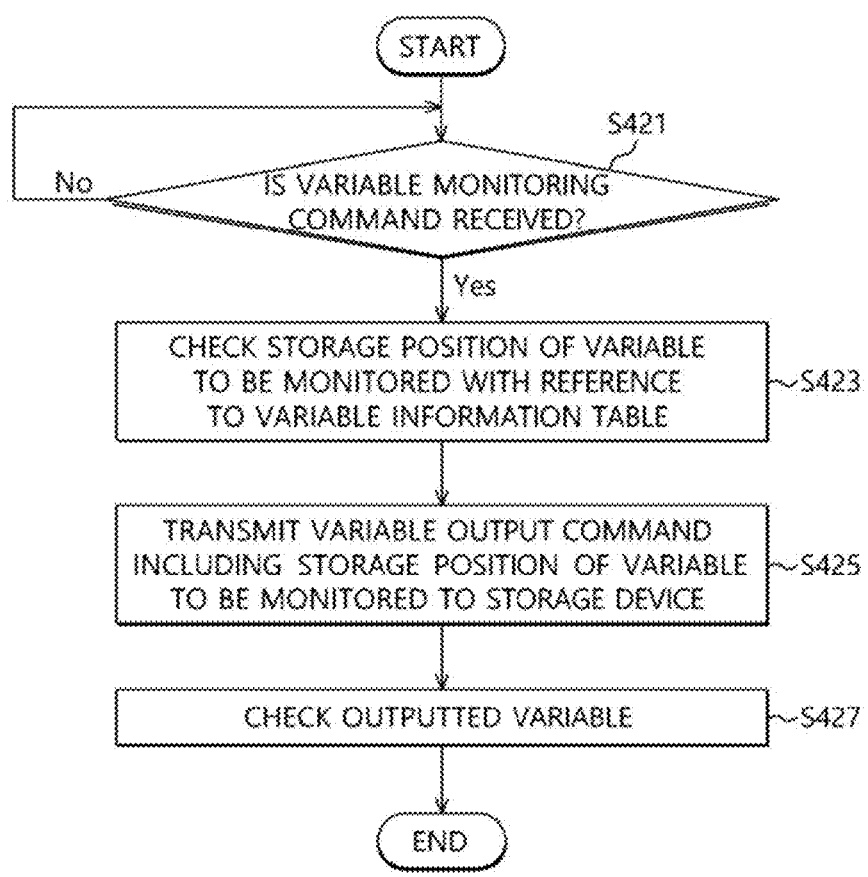
FIG. 8 is a flowchart illustrating in detail step S420 of FIG. 4.

FIG. 7 is a flowchart showing a method for testing a memory in accordance with an embodiment of the present disclosure. FIG. 8 is a flowchart illustrating in detail step S420 of FIG. 7. In the description of the memory test method in accordance with the embodiment with reference to FIGS. 7 and 8, FIGS. 1 and 2 will also be used for reference.

At step S410, the processor 110 of the test device 100 may transmit a test command CMD_T to the data storage device 200. Here, the test device 100 may receive the test command CMD_T from the external element, i.e., the tester. The data storage device 200 that has received the test command CMD_T from the test device 100 may provide to the test device 100 a signal representing that the test command CMD_T has been received.

At step S420, the processor 110 of the test device 100 may monitor in real time a variable generated as the firmware FW is driven in the data storage device 200 to perform a test corresponding to the test command CMD_T transmitted at step S410. Step S420 will be described in detail with reference to FIG. 8.

Referring to FIG. 8, which provides a detailed description of step S420 shown in FIG. 7, at step S421, the processor 110 of the test device 100 may determine whether a variable monitoring command CMD_VM is provided from an external element. The variable monitoring command CMD_VM may include information such as a variable name. If the variable monitoring command CMD_VM is provided from the external element, step S423 may be performed.

At step S423, the processor 110 may check, with reference to the variable information table VIT stored in the memory 120, a position in which a variable to be monitored is stored. For example, the processor 110 may check an address matched with the variable name included in the variable monitoring command CMD_VM with reference to the variable information table VIT, and determine the corresponding address as the storage position of the variable to be monitored is stored.

At step S425, the processor 110 of the test device 100 may transmit the variable output command CMD_VO including the storage position of the variable to be monitored, to the data storage device 200. The data storage device 200 that has received the variable output command CMD_VO from the test device 100 may output, to the test device 100, a variable requested to be outputted from the test device 100 among the variables stored in the variable table VT stored in the random access memory 223.

At step S427, the processor 110 may check the variable (hereinafter, referred to as 'output variable') outputted from the data storage device 200.

Referring back to FIG. 7, at step S430, the processor 110 of the test device 100 may determine whether the output variable is valid. For example, the processor 110 may determine whether the output variable is valid by comparing the output variable with an expected variable. In detail, when the output variable is matched with the expected variable, the processor 110 may determine that the output variable is valid. When the output variable is not matched with the expected variable, the processor 110 may determine that the output variable is invalid. If the output variable is invalid, step S460 may be performed. If the output variable is valid, step S440 may be performed.

At step S440, the processor 110 may determine whether the result of the test provided from the data storage device 200 is normal. For instance, in the case of the read test, the processor 110 may determine whether the result of the test is normal by reading out the test data DATA_T programmed at the position desired to perform the test, and determining whether the read-out test data DATA_T is matched with the test data DATA_T programmed at the beginning. The method of determining whether the result of the test for the data storage device 200 is normal may be diverse depending on the kind of the test. The technique of determining whether the test and the test result are normal is a well-known technique in this art; therefore, further description thereof will be omitted.

If the test result is normal, step S450 may be performed, and if the test result is not normal, step S460 may be performed.

At step S450, the processor 110 of the test device 100 may transmit a subsequent test command CMD_T to the data storage device 200, and return to step S420.

At step S460 the processor 110 of the test device 100 may determine that the data storage device 200 is defective, and interrupt the test.

In the embodiment, during the test for the data storage device 200, a variable generated through the driving of the firmware FW is monitored in real time. Therefore, according to the result of the test, not only may it be verified whether the data storage device 200 is normally operated, but it may also be verified whether the firmware FW is normally driven. As a result, it may be more rapidly checked whether the data storage device 200 is defective.

Figures 9A, 9B:
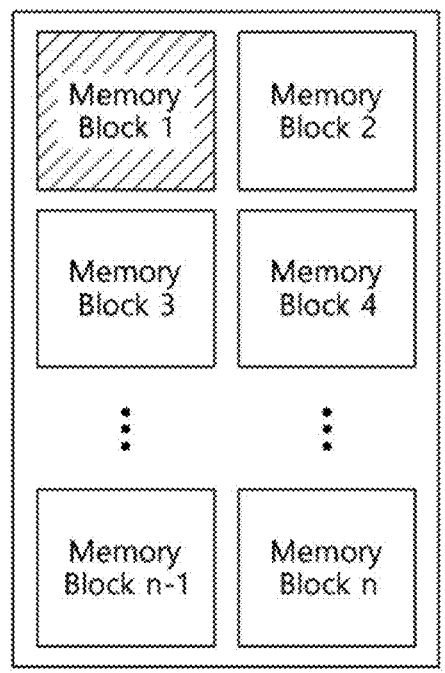
FIG. 9A is a block diagram illustrating an example of a configuration of a nonvolatile memory device of FIG. 1.
FIG. 9B is a diagram illustrating a read count table in which read count values are stored by each memory block of FIG. 6A.
Figures 9C, 9D:
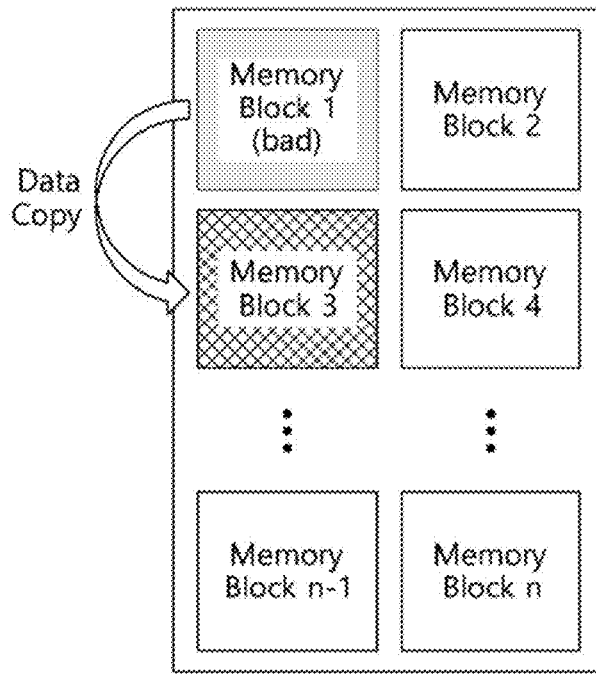
FIG. 9C is a diagram illustrating an example in which data of a memory block, which has a read count value greater than or equal to threshold value, is copied to an empty memory block.
FIG. 9D is a diagram illustrating an example of a change in a read count value corresponding to each of the memory block, when the read count value is greater than or equal to the threshold value, and the memory block to which the data has been copied.
Figure 9E:
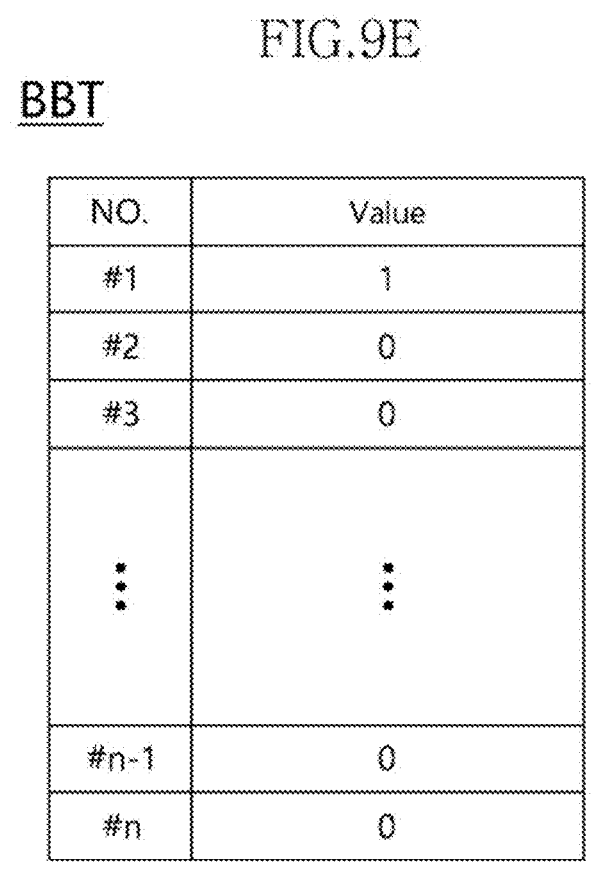

FIG. 9A is a block diagram Illustrating an example of a configuration of a nonvolatile memory device 210 of FIG. 1. FIG. 9B is a diagram illustrating a read count table RCT in which read count values are stored by each memory block of FIG. 9A. FIG. 9C is a diagram illustrating an example in which data of a memory block, which has a read count value greater than or equal to threshold value, is copied to an empty memory block. FIG. 9D is a diagram illustrating an example of a change in a read count value corresponding to each of the memory block, when the read count value is greater than or equal to the threshold value and the memory block to which the data has been copied. FIG. 9E is a diagram illustrating an example of a change in a variable corresponding to the memory block, the read count value of which has been the threshold value or more, in a bad block table BBT.

Referring to FIG. 9A, a case where the nonvolatile memory device 210 of the data storage device 200 includes n memory blocks, and performs a read test for a memory block 1, will be described. For the sake of convenience in description, it is assumed that a read count value for the first memory block #1 is 499, as shown in FIG. 9B, and a threshold read count is 500.

If a read test is performed to the memory block 1, as shown in FIG. 9D, the read count #1 of the memory block 1 may be changed to 500. Here, the test device 100 may perform the following operation to check whether the firmware FW is normally driven. The test device 100 may request output of a read count to the data storage device 200 using the variable output command CMD_VO, and check whether the read count is valid based on the read count outputted from the data storage device 200. Here, the test device 100 may request read counts for all of the memory blocks included in the nonvolatile memory device 210 or, alternatively, request a read count #1 for only the memory block 1.

As shown in FIG. 9D, because the read count #1 of the memory block 1 has changed to 500, the test device 100 may determine that the read count #1 of the memory block 1 is valid. Meanwhile, because the read count #1 of the memory block 1 has reached the threshold value, the test device 100 may perform, according to the policy, the following operation to verify whether a read reclaim operation has been normally performed. During the read reclaim operation, the data of the memory block 1 may be copied to another memory block, and registering the memory block 1 as a bad block. For the sake of convenience in description, as shown in FIG. 9C, it is assumed that data of the memory block 1 has been copied to a memory block 3.

The test device 100 may request output of a bad block table BBT (see FIG. 9E) and a read count table RCT (see FIG. 9D) to the data storage device 200 using the variable output command CMD_VO. If the bad block table BBT and the read count table RCT are outputted from the data storage device 200, the test device 100 may check whether a value (e.g., '1') representing that the memory block 1 is a bad block has been stored in a region corresponding to the memory block 1 in the bad block table BBT. Furthermore, it may be checked that a value (e.g., '0') representing that use of the memory block 3 has started has been stored in a region corresponding to the memory block 3 in the read count table RCT.

If the variable of the read count table RCT and the variable of the bad block table BBT are invalid, the test device 100 may determine that the firmware FW is not normally driven and interrupt the test.

Figure 10:
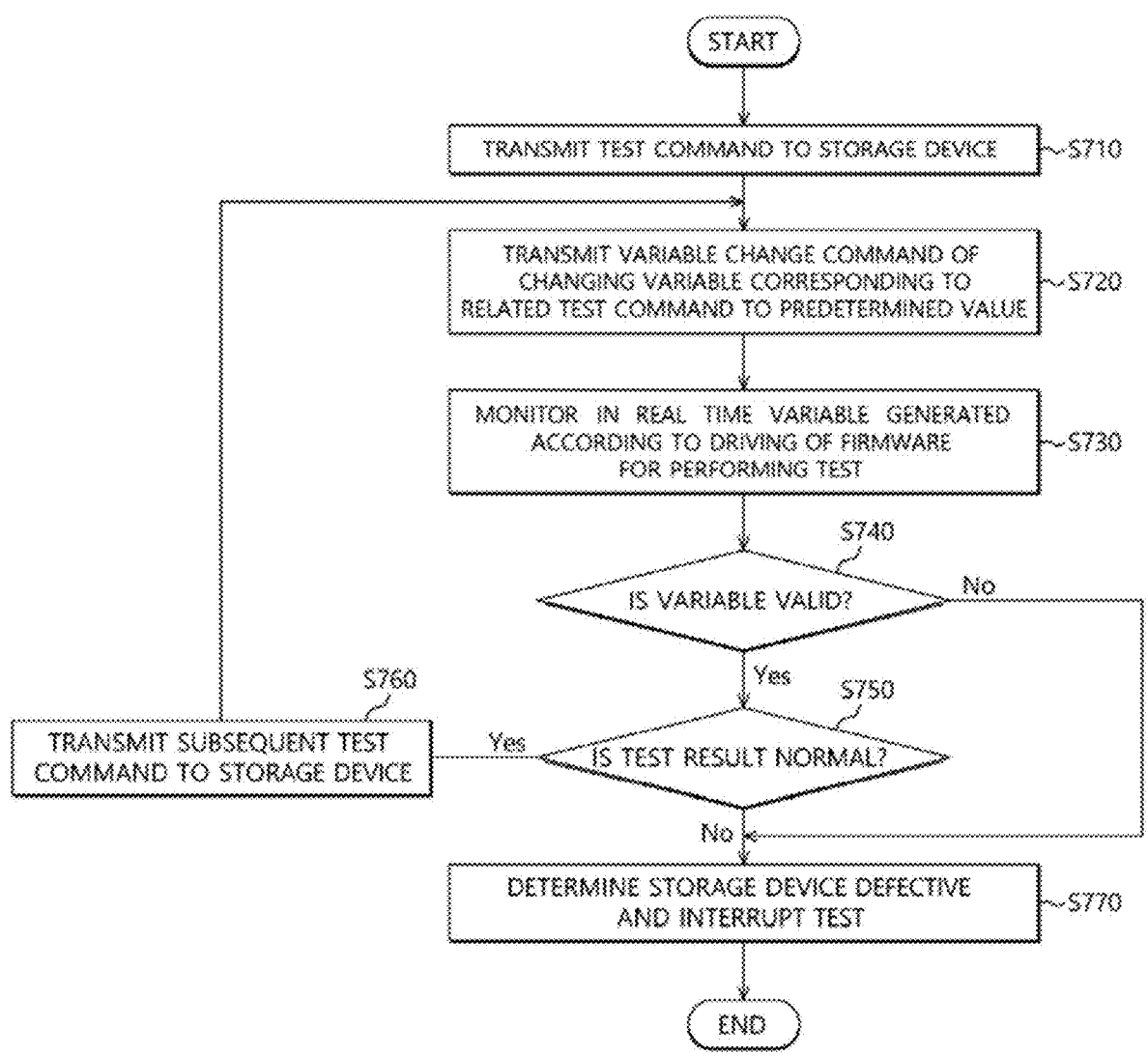
FIG. 10 is a flowchart illustrating a method for testing a memory in accordance with another embodiment of the present disclosure.

FIG. 10 is a flowchart illustrating a method for testing a memory in accordance with another embodiment of the present invention. FIG. 11 is a flowchart illustrating in detail step S720 of FIG. 10. In the description of the memory test method in accordance with the embodiment with reference to FIGS. 10 and 11, FIGS. 1 to 3 will also be used for reference. Furthermore, descriptions overlapping with that of the memory test method described with reference to FIGS. 7 and 8 will be omitted.

At step S710, the processor 110 of the test device 100 may transmit a test command CMD_T to the data storage device 200.

At step S720, the processor 110 may transmit, to the data storage deice 200, a variable change command CMD_VC for changing a variable corresponding to the test command CMD_T transmitted at step S710 to a predetermined value.

For example, if the test command CMD_T transmitted at step S710 is a command for a program operation test to the memory block 1, the processor 110 may transmit, to the data storage device 200, a variable change command CMD_VC for changing, to a predetermined value, a program count value of the memory block 1 in the variable table VT stored in the random access memory 223 of the data storage device 200.

If the test command CMD_T transmitted at step S710 is a command for a read operation test to the memory block 1, the processor 110 may transmit, to the data storage device 200, a variable change command CMD_VC for changing a read count value of the memory block 1 in the variable table VT to a predetermined value.

Here, the predetermined value may be a value closest to the threshold value. For example, in the case where a read count threshold value for the memory block 1 is 500, the predetermined value may be 499. Here, in the conventional art, to verify whether a read reclaim operation to the first memory block is normally performed according to the policy, the read test to the memory block 1 should be performed total 100 times. However, in the embodiment, as shown in FIG. 12, since the read count of the memory block 1 is forcibly changed using the variable change command CMD_VC to 499 (that is, a value closest to the threshold value), the number of times of read tests which should be performed to verify the read reclaim operation of the memory block 1 may be reduced. As a result, the test time may be reduced.

At step S730, the processor 110 may monitor in, real time a variable generated as the firmware FW is driven to perform the test in the data storage device 200. The detailed method of monitoring the variable has been described with reference to FIG. 5; therefore, further description thereof will be omitted.

At step S740, the processor 110 may determine whether the output variable is valid. For example, the processor 110 may determine whether the output variable is valid by comparing the output variable with an expected variable. If the output variable is invalid, step S770 may be performed. If the output variable is valid, step S750 may be performed.

At step S750, the processor 110 may determine whether the result of the test provided from the data storage device 200 is normal. If the test result is normal, step S760 may be performed, and if the test result is not normal, step S770 may be performed.

At step S760, the processor 110 may transmit a subsequent test command CMD_T to the data storage device 200, and return to step S720.

At step S770, the processor 110 may determine that the data storage device 200 is defective, and interrupt the test.

In accordance with embodiments, it is possible to monitor in real time variables generated by driving firmware (FW) during a process of testing a data storage device.

Therefore, not only may it be verified whether the data storage device is normally operated, but it may also be verified in real time whether the firmware is normally driven.

As a result, it may be more rapidly checked whether the data storage device is defective.

While various embodiments have been described above, it will be understood to those skilled in the art that the embodiments described are examples only. Accordingly, the system and method for testing a memory described herein should not be limited based on the described embodiments.

What is claimed is:

1. A memory test system, comprising:
a data storage device comprising a nonvolatile memory device, and a controller configured to control an operation of the nonvolatile memory device; and
a test device configured to check whether the data storage device performs a normal operation,
wherein the test device transmits a test command for testing an operation of the data storage device to the data storage device, transmits a variable output command for requesting output of a variable generated by an execution of firmware which performs the test to the data storage device while the operation corresponding to the test command is being performed and verifies whether the firmware is normally executed based on the variable outputted from the data storage device.

2. The memory test system according to claim 1, wherein, when the firmware is normally executed, the test device determines whether the data storage device operates normally based on a test result transmitted from the data storage device.

3. The memory test system according to claim 1, wherein, when the firmware is normally executed, the test device determines that the data storage device is defective regardless of a result of the test which is provided from the data storage device, and interrupts the test for the data storage device.

4. The memory test system according to claim 1,
wherein the nonvolatile memory device comprises a plurality of memory blocks, and
wherein the firmware is stored in a system data region in at least one memory block among the plurality of memory blocks.

5. The memory test system according to claim 1, wherein the firmware comprises:
a plurality of source code groups corresponding to a plurality of operations; and
a plurality of driving check codes inserted between the respective source code groups.

6. The memory test system according to claim 5, wherein the controller comprises a random access memory including a driving check region in which values representing the respective source code groups of the firmware are stored as a bitmap.

7. The memory test system according to claim 6, wherein each of the plurality of driving check codes is driven such that when a corresponding one of the source code groups is driven, a first value representing that the source code group is driven, is stored in a corresponding bit of the driving check region.

8. The memory test system according to claim 7, wherein the test device calculates a test coverage for the firmware based on the total number of bits of the driving check region and the number of bits in which the first values are stored in the driving check region.

9. The memory test system according to claim 6, wherein the random access memory includes a variable table in which variables generated through the driving of the firmware are stored.

10. The memory test system according to claim 9, wherein the test device requests the data storage device to change a variable corresponding to the test among the variables stored in the variable table to a predetermined value, before requesting the output of the variable.

11. The memory test system according to claim 1,
wherein the test device includes a memory in which a variable information table including a name and an address of the variable is stored, and
wherein, when the name of the variable is inputted from an external element, the test device transmits, to the data storage device, the address corresponding to the inputted name of the variable with reference to the variable information table, and requests an output of the variable.

12. A method for testing a memory, comprising:
transmitting, to a data storage device, a test command for performing a test for the data storage device;
monitoring a variable generated by an execution of firmware which performs the test corresponding to the test command while the test is performed in the data storage device;
determining whether the variable is valid; and
determining that a test result received from the data storage device is normal when the variable is valid.

13. The method according to claim 12, wherein the monitoring of the variable comprises:
determining whether a variable monitoring command including information about the variable is received;
checking a storage position of the variable with reference to a variable information table when the variable monitoring command is received;

transmitting a variable output command including the storage position of the variable to the data storage device; and checking the variable outputted from the data storage device.

14. The method according to claim 13, wherein the information about the variable includes a variable name, and wherein the variable name and the storage position of the variable are stored and matched with each other in the variable information table.

15. The method according to claim 13, wherein the determining when the variable is valid comprises:

comparing the variable outputted from the data storage device with an expected variable; and determining that the variable is valid when the variable outputted from the data storage device is matched with the expected variable, and determining that the variable is invalid when the variable outputted from the data storage device is not matched with the expected variable.

16. The method according to claim 12, further comprising, before the monitoring of the variable, transmitting a variable change command for changing the variable to a predetermined value, to the data storage device.

17. The method according to claim 12, further comprising, after determining whether or not the variable is valid, determining that the data storage device is defective when the variable is invalid regardless of whether the test result is received from the data storage device or whether the test result is normal, then interrupting the test.

18. An operating method for a memory test device, the method comprising:

transmitting, to a data storage device, a test command for testing an operation of the data storage device;

transmitting, to the data storage device, a variable output command for requesting output of a variable generated by an execution of firmware which performs the operation corresponding to the test command; and verifying whether the firmware is normally executed based on the variable outputted from the data storage device, wherein the data storage device includes the firmware and a memory device, and wherein the firmware controls the memory device when the firmware is executed.

* * * * *